United States Patent
Dimitriadis

(10) Patent No.: US 8,165,859 B2
(45) Date of Patent: Apr. 24, 2012

(54) METHOD OF DESIGNING AN AIRFOIL ASSEMBLY

(75) Inventor: Georgios Dimitriadis, Bristol (GB)

(73) Assignee: Airbus Operations Limited, Bristol (GB)

( * ) Notice: Subject to any disclaimer, the term of this patent is extended or adjusted under 35 U.S.C. 154(b) by 342 days.

(21) Appl. No.: 12/457,370

(22) Filed: Jun. 9, 2009

(65) Prior Publication Data

US 2009/0312989 A1 Dec. 17, 2009

(30) Foreign Application Priority Data

Jun. 11, 2008 (GB) .................................. 0810645.2

(51) Int. Cl.
*G06F 17/50* (2006.01)
*G06G 7/48* (2006.01)
*B64F 5/00* (2006.01)

(52) U.S. Cl. ..................................... 703/7; 703/2; 702/42

(58) Field of Classification Search ................... 703/2, 7, 703/6; 700/94; 345/70, 473; 702/10, 42
See application file for complete search history.

(56) References Cited

U.S. PATENT DOCUMENTS

| | | | |
|---|---|---|---|
| 6,125,333 A | 9/2000 | Pun | |
| 6,970,171 B2* | 11/2005 | Baraff et al. .................. | 345/473 |
| 2002/0177985 A1* | 11/2002 | Kraft et al. ...................... | 703/7 |
| 2004/0243310 A1* | 12/2004 | Griffin et al. .................... | 702/10 |
| 2007/0016388 A1 | 1/2007 | Shimel et al. | |
| 2007/0282571 A1 | 12/2007 | Rassaian et al. | |
| 2009/0070091 A1* | 3/2009 | Hanke et al. ..................... | 703/18 |
| 2010/0268517 A1* | 10/2010 | Calmels ........................... | 703/2 |

OTHER PUBLICATIONS

Schuhmacher et al., "Multidisciplinary Design Optimization of a Regional Aircraft Wing Box", *American Institute of Aeronautics and Astronautics*, pp. 1-10 (No Date).

* cited by examiner

*Primary Examiner* — Thai Phan

(74) *Attorney, Agent, or Firm* — Nixon & Vanderhye P.C.

(57) ABSTRACT

A method of analyzing a finite element model of an airfoil assembly. The airfoil assembly comprises a main airfoil element and a plurality of control surfaces. The method comprises: generating a loads interface model of the airfoil assembly comprising: data which defines the spatial positions of a set of nodes, and data which associates each node with either the main element or one of the control surfaces. Load data is generated which defines loads acting on the nodes of the loads interface model, and mapped onto a finite element model to produce a loaded finite element model. A stress analysis is then performed on the loaded finite element model, and the finite element model can be refined as a result of the stress analysis.

7 Claims, 4 Drawing Sheets

METHOD OF DESIGNING AN AIRFOIL ASSEMBLY

This application claims priority to British Application No. 0810645.2 filed 11 Jun. 2008, the entire contents of which is hereby incorporated by reference.

FIELD OF THE INVENTION

The present invention relates to a method of designing an airfoil assembly.

BACKGROUND OF THE INVENTION

A conventional method of designing an aircraft wing box is described in *Multidisciplinary Design Optimization Of A Regional Aircraft Wing Box*, G. Schuhmacher et al., AIAA. A simplified Beam Aircraft Model (BAM) is coupled with an aerodynamic panel model to analyze aero-elastic effects. It is also used by a loads group to calculate external loads resulting from flight and ground maneuvers. The loads are partitioned into aerodynamic, inertia and concentrated loads and supplied to a structures group as running loads along the elastic axes of fuselage, wing, control surfaces etc.

A problem with the use of a simplified BAM as in Schuhmacher et al. is that the loads for the control surfaces and wing may not be consistent. That is, the sum of the loads acting on the wing and the control surfaces attached to the wing (flaps, ailerons etc.) may not add up to the total loads acting on the wing.

SUMMARY OF THE INVENTION

The present invention provides a method of analyzing a finite element model of an airfoil assembly, the airfoil assembly comprising a main airfoil element and a plurality of control surfaces, the method comprising:
a. generating a loads interface model of the airfoil assembly comprising:
   i. data which defines the spatial positions of a set of nodes, and
   ii. data which associates each node with either the main airfoil element or one of the control surfaces;
b. generating load data which defines loads acting on the nodes of the loads interface model;
c. generating a finite element model of the airfoil assembly comprising:
   iii. data which defines the spatial position of a set of nodes, and
   iv. data which defines forces acting between the nodes;
d. mapping the load data onto the finite element model to produce a loaded finite element model; and
e. performing a stress analysis on the loaded finite element model.

Associating each node with either a main airfoil element or a control surface enables the loads on the control surfaces to be modeled more accurately. Thus the higher quality of the data can result in a lighter design to be generated.

Another advantage of associating each node with either a main airfoil element or a control surface is that it enables multiple loads interface models of the airfoil assembly to be generated, each comprising: data which defines the spatial positions of a set of nodes, and data which associates each node with either the main airfoil element or one of the control surfaces; each loads interface model modeling the control surfaces in a different configuration. One of the these various models can then be selected for processing.

BRIEF DESCRIPTION OF THE DRAWINGS

Embodiments of the invention will now be described with reference to the accompanying drawings, in which.

DETAILED DESCRIPTION OF EMBODIMENT(S)

Figure 1:
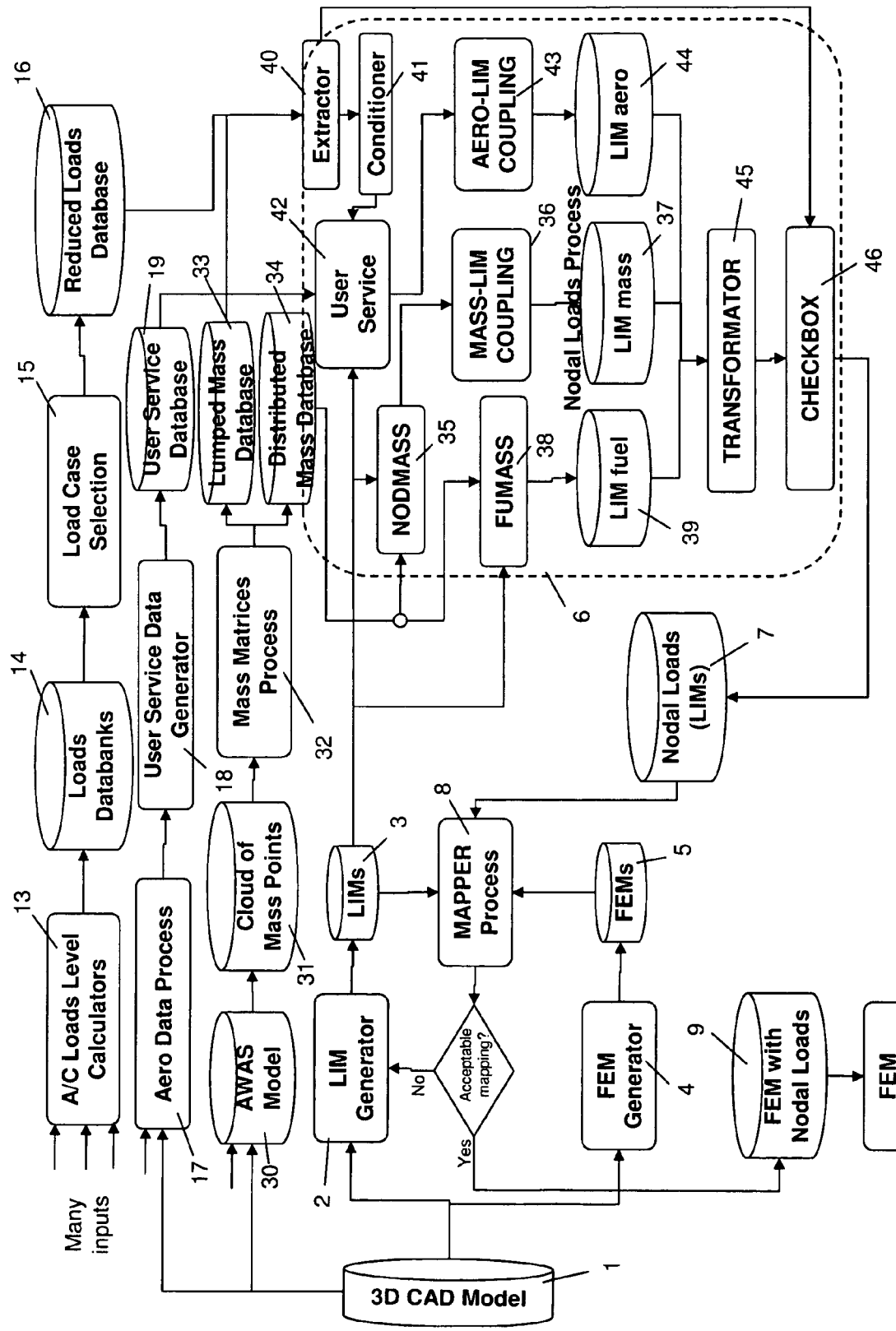
FIG. 1 is a flow diagram showing a computer-implemented method of designing an aircraft.

A computer-implemented method of designing an aircraft is shown in FIG. 1. A 3D computer aided design (CAD) model 1 is used by a loads interface model (LIM) generator 2 to generate a LIM of the aircraft which is stored in a database 3. The 3D CAD model 1 is also used by a finite element model (FEM) generator 4 to generate a FEM of the aircraft which is stored in a database 5.

Figure 2:
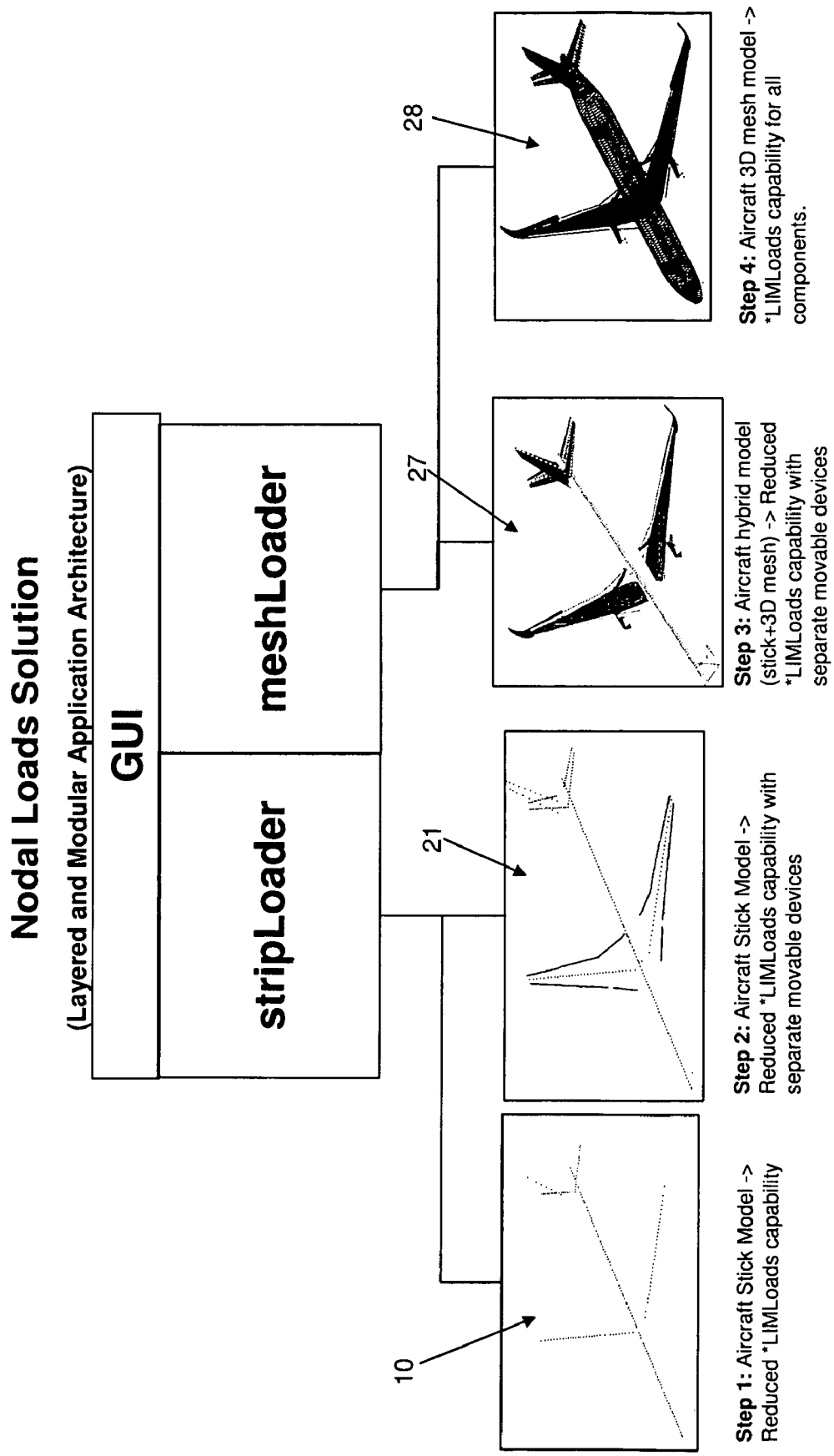
FIG. 2 shows various loads interface models (LIMs) for use in the process of FIG. 1.

The LIM is refined in a number of steps, and a first step in the process is shown at 10 in FIG. 2. In this initial step the LIM contains data which defines the spatial coordinates of a set of nodes representing a crude stick model of the aircraft. Thus each node is either associated with the fuselage, left wing, right wing, left horizontal tail plane (HTP), right HTP or vertical tail plane. FIG. 2 also shows various more refined iterations of the LIM which will be explained further below.

The FEM 5 contains data which defines the spatial coordinates of a set of nodes, data which defines forces (such as stiffness forces) acting between the nodes, and optionally other data such as material properties.

Returning to FIG. 1, a nodal loads process 6 generates load data which defines loads acting on the nodes of the LIM 3, this load data being stored in a database 7. The load data defines various forces and moments acting on the nodes of the LIM, namely: (Fx, Fy, Fz, Mx, My, Mz) where Fx is the force acting in the x-direction, Mx is the moment about the x-axis and so on. The load data is calculated by a so-called "strip loading" process in which all of the loads acting on a strip of the component axis are lumped together at the position of the LIM node, which is typically at the centre of the strip on a reference axis.

The load data is typically "design critical". That is, it defines the maximum loads which are likely to be experienced by the aircraft under a particular set of flight conditions. The flight conditions are defined in an aircraft loads level calculator 13 which will be explained in more detail below.

A mapper process 8 then maps the load data from database 7 onto the FEM 5. If the mapping is unacceptable, a new LIM is generated by the LIM generator 2 and the nodal loads process 6 starts again. If there is an acceptable mapping then a loaded FEM is stored in database 9. A FEM analysis tool 12 performs a stress analysis on the loaded FEM. The output of the FEM analysis can then be used to refine the FEM as a result of the stress analysis.

The inputs to the nodal loads process 6 are (in general terms) the LIM from the database 3, load data, aerodynamic input data and mass input data.

The aerodynamic input data is obtained as follows. First, aerodynamic data processor 17 collects aerodynamic data from various inputs, such as Computational Fluid Dynamics (CFD) models and experimentally derived wind tunnel analysis data. The aerodynamic data may for instance be in the form of pressure plots across the surface of the aircraft under various different flight conditions, along with data describing the geometry of the aircraft associated with the pressure plots. The data is stored in a user service database 19 by a user service data generator 18. Optionally the user service data generator 18 may modify the data before it is stored in the data base 19. For instance wind tunnel analysis data based on an old model may be modified to reflect the addition of a new flap to the wing, and so on.

The load data is obtained as follows. Aircraft loads level calculators 13 receive various inputs and derive global aircraft load levels based on various flight conditions (such as a wind gust). This load data includes load data per component—for instance for the flaps, slats and other control surfaces. The load data is stored in databanks 14. A sub-set of the load data is selected by a user at 15 and stored in a reduced loads database 16.

The mass data is generated by first generating a mass model in database 30. This is generated from various inputs such as the weights of various control surface actuators, material weights etc., and mapped onto the geometry of the 3D CAD model 1. A cloud of mass points 31 is then derived from the mass model, processed by mass matrices process 32 (which selects a load case based on for example an amount of fuel, number of passengers, payload etc.) and stored in a lumped mass database 33 and a distributed mass database 34. The lumped mass database 33 contains masses associated with various nodes on the structure, whereas the distributed mass database 34 contains masses associated with a more widely distributed set of points.

The mass data is initially defined for a specific aircraft geometry. However, the mass model 30 contains a set of scaling factors that allow the mass data to be scaled according to any user-defined changes in the aircraft geometry.

Distributed mass data from database 34 is mapped onto the LIM by a NODMASS module 35. The resulting inertial forces are then calculated by a MASS-LIM COUPLING module 36 and stored in a database 37.

Fuel mass data from database 34 is mapped onto the LIM by a FUMASS module 38. The resulting fuel mass forces are then stored in a database 39.

The data from reduced loads database 16 is processed by an extractor 40, filtered by a conditioner 41 (for instance to smooth the data) and input to a user service module 42. The user service module 42 takes the aerodynamic data from database 19 and passes it to an AERO-LIM COUPLING module 43 which maps the aerodynamic data onto the LIM from database 3, and the resulting data is stored in data base 44.

The load data from databases 37,39,44 is then combined into a single data set by transformator 45, and then stored in database 7 after being checked against the load data from the reduced loads database 16 by a checkbox module 46. The checkbox module 46 checks that the global loading data from the transformator 45 is consistent with the data from the reduced loads database 16.

Figure 3:
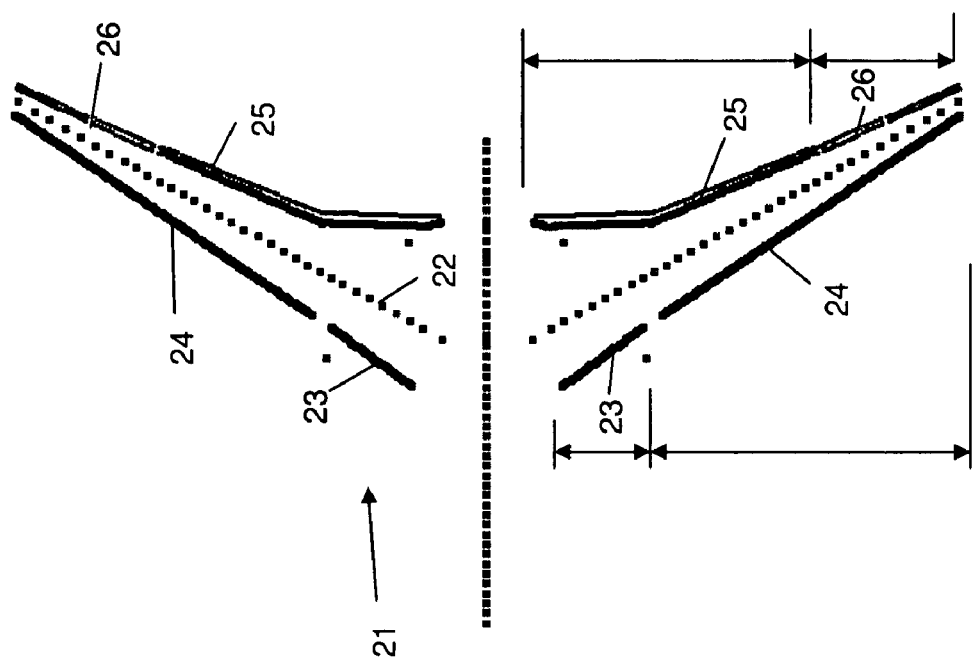
FIG. 3 shows one of the LIMs of FIG. 2 in more detail.

In a subsequent iteration of the design process of FIG. 1, a LIM 21 shown in FIG. 2 is used in place of the LIM 10. In this case the LIM 21 is more than a basic stick model, but also has nodes which are associated with various control surfaces of the wings, horizontal tail planes and vertical tail plane. A more detailed view of the LIM 21 is shown in FIG. 3. The LIM comprises nodes 22 associated with the main wing element, and nodes 23-26 associated with various control surfaces: namely droop nose devices, slats, flaps and ailerons respectively. Therefore the LIM 21 contains data which defines the spatial positions of the set of nodes 22-26, and data which associates each node with either the main wing element or one of the control surfaces.

In a further iteration of the design process, a LIM 27 shown in FIG. 2 is used in place of the LIM 21. In this case the LIM 27 is a combination of the LIM 21 with a 3D mesh. In a final iteration of the design process, a LIM 28 shown in FIG. 2 is used in place of the LIM 27. In this case the LIM 28 is a full 3D mesh model.

Figure 5:
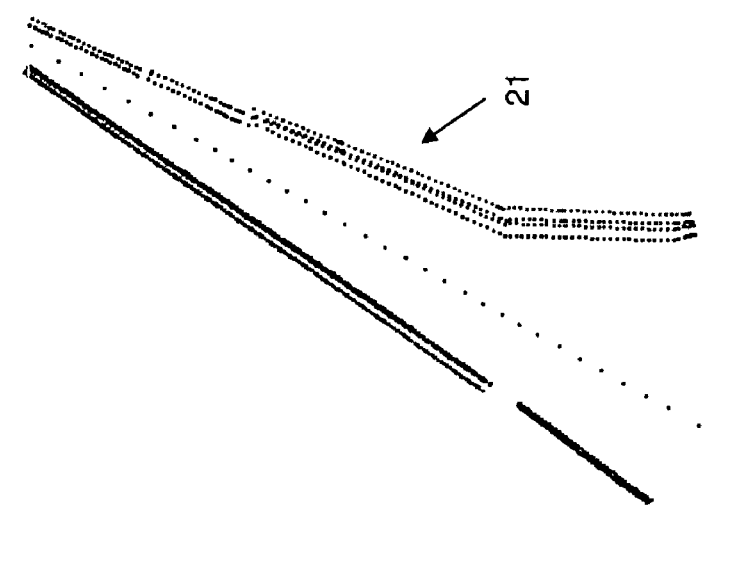
FIG. 5 is a plan view showing the various LIMs with the control surfaces in different configurations.
Figure 4:
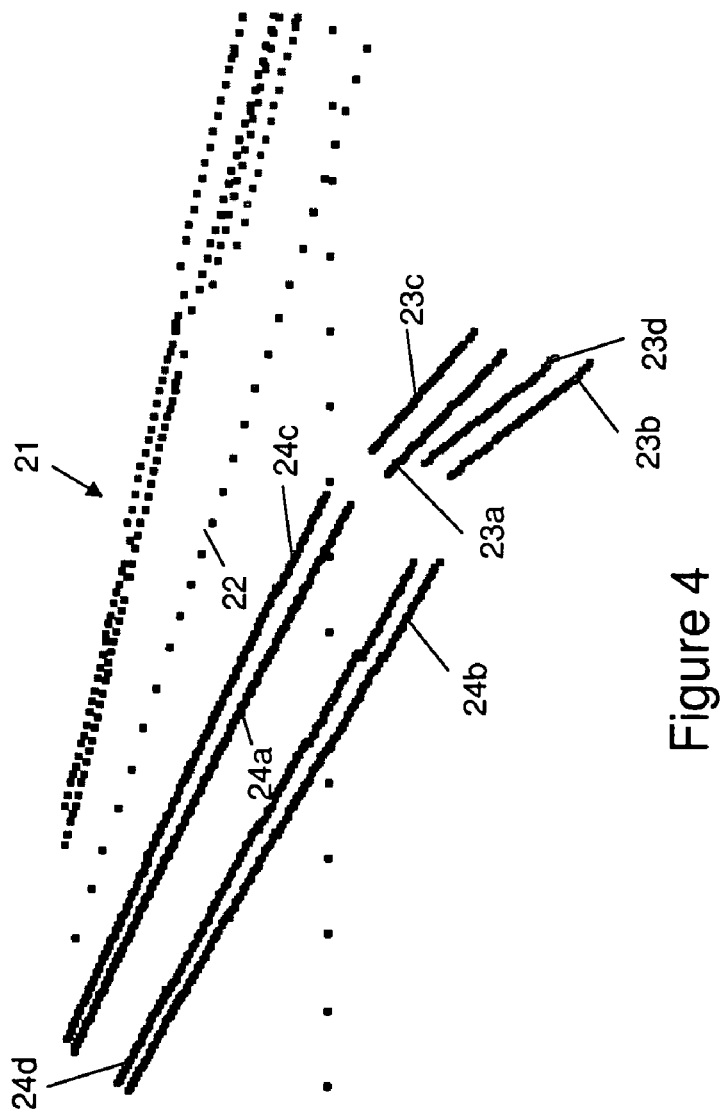
FIG. 4 is a perspective view showing various LIMs with the control surfaces in different configurations.

FIGS. 4 and 5 are perspective and plan views of the LIM 21, showing how the LIM can be modified to change the position and/or orientation of one or more of the control surfaces relative to the main wing element. FIGS. 4 and 5 also show how the LIM comprises two separate models: an aerodynamic model which is used by AERO-LIM COUPLING module 43 for aerodynamic loads, and an inertial model which is used by FUMASS module 38 and MASS-LIM COUPLING module 36 for inertial loads. For all models the nodes 22 along the main wing element remain fixed.

Considering first the aerodynamic model, with the droop nose device and slats in their retracted positions, the nodes of the LIM are indicated at 23*a* and 24*a* respectively, and with the droop nose device and slats in their deployed positions, the nodes of the LIM are indicated at 23*b* and 24*b* respectively. For the inertial model, with the droop nose device and slats in their retracted positions, the nodes of the LIM are indicated at 23*c* and 24*c* respectively, and with the droop nose device and slats in their deployed positions, the nodes of the LIM are indicated at 23*d* and 24*d* respectively.

Thus a user can select any of the various LIMs shown in FIG. 4 to model the loads on the wing with the control surfaces in a desired configuration, and that model is mapped onto the FEM 5 by mapper process 8.

Although the invention has been described above with reference to one or more preferred embodiments, it will be appreciated that various changes or modifications may be made without departing from the scope of the invention as defined in the appended claims.

The invention claimed is:

1. A method of analysing a finite element model of an airfoil assembly, the airfoil assembly comprising a main airfoil element and a plurality of control surfaces, the method comprising:
   a. generating a loads interface model of the airfoil assembly comprising:
      i. data which defines the spatial positions of a set of nodes, and
      ii. data which associates each node with either the main airfoil element or one of the control surfaces;
   b. generating load data which defines loads acting on the nodes of the loads interface model;
   c. generating a finite element model of the airfoil assembly comprising:
      iii. data which defines the spatial position of a set of nodes, and
      iv. data which defines forces acting between the nodes;
   d. mapping the load data onto the finite element model to produce a loaded finite element model; and
   e. performing a stress analysis on the loaded finite element model, said method steps implemented on a data processor.

2. The method of claim 1 further comprising generating multiple loads interface models of the airfoil assembly, each comprising: data which defines the spatial positions of a set of nodes, and data which associates each node with either the main airfoil element or one of the control surfaces; each loads interface model modelling the control surfaces in a different configuration; and selecting one of the multiple loads interface models for step b.

3. The method of claim 1 wherein the airfoil comprises an aircraft wing.

4. The method of claim 1 wherein the control surfaces comprise droop nose devices, slats, flaps or ailerons.

5. The method of claim 1 wherein the load data comprises aerodynamic load data.

6. The method of claim 1 wherein the load data comprises inertial load data.

7. The method of claim 1 wherein the load data comprises inertial fuel load data.

* * * * *